(12) United States Patent
Nagaraju et al.

(10) Patent No.: US 12,388,461 B2
(45) Date of Patent: Aug. 12, 2025

(54) TIMER-BASED RESOLVER INTEGRAL DEMODULATION

(71) Applicant: Hamilton Sundstrand Corporation, Charlotte, NC (US)

(72) Inventors: Divya Nagaraju, Karnataka (IN); Ashish Vijay, Rajasthan (IN); Sundaram Kaliyugavaratharajan, Karnataka (IN); Kannan Thiagarajan, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 226 days.

(21) Appl. No.: 18/348,435

(22) Filed: Jul. 7, 2023

(65) Prior Publication Data

US 2024/0313798 A1 Sep. 19, 2024

(30) Foreign Application Priority Data

Mar. 16, 2023 (IN) .............................. 202311017662

(51) Int. Cl.
*H03M 1/64* (2006.01)
(52) U.S. Cl.
CPC .................................... *H03M 1/645* (2013.01)
(58) Field of Classification Search
CPC .......... H03M 1/64; H03M 1/66; H03M 1/645; H03M 1/485
See application file for complete search history.

(56) References Cited

U.S. PATENT DOCUMENTS 5,053,715 A * 10/1991 Andermo .............. H03M 1/645
340/870.37
5,455,498 A * 10/1995 Kakimoto .............. G01D 5/243
318/605

(Continued)

FOREIGN PATENT DOCUMENTS

DE 102016223938 B4 6/2018
EP 0458148 A2 11/1991

(Continued)

OTHER PUBLICATIONS

Abstract for DE102016223938 (B4), Published: Jun. 14, 2018, 1 page.

(Continued)

*Primary Examiner* — Lam T Mai
(74) *Attorney, Agent, or Firm* — CANTOR COLBURN LLP

(57) ABSTRACT

A digital signal processing system to determine a position of a resolver includes a digital signal processor that includes first timer and second timer. The first timer creates a resolver excitation signal from a series of samples and creates an incrementing Crossing signal each time the resolver excitation signal crosses zero. When the Crossing signal has a first value, a multiplexer provides resolver sine signals to an analog to digital converter to convert the resolver sine signal to a series of digital sine samples, and the second timer stores the series of digital sine samples in a sine sample buffer. When the Crossing signal has a second value, the multiplexer provides the resolver cosine signal to the analog to digital converter to convert the resolver cosine signal to a series of digital cosine samples, and the second timer stores the series of digital cosine samples in a buffer.

15 Claims, 8 Drawing Sheets

(56) References Cited

U.S. PATENT DOCUMENTS

| | | | |
|---|---|---|---|
| 9,315,106 B2* | 4/2016 | Fu | B60L 3/0038 |
| 9,397,676 B1* | 7/2016 | Nguyen | H03M 1/0872 |
| 10,027,344 B1* | 7/2018 | Bird | H03M 1/485 |
| 10,256,836 B2 | 4/2019 | Bird et al. | |
| 10,408,643 B2* | 9/2019 | Chellamuthu | G01D 5/243 |
| 11,177,987 B1 | 11/2021 | Jefremow et al. | |
| 11,231,296 B2 | 1/2022 | Hess et al. | |
| 11,353,337 B2 | 6/2022 | Takai | |
| 11,722,343 B1* | 8/2023 | Kaliyugavaratharajan | H04L 27/06 375/340 |
| 2006/0132338 A1* | 6/2006 | Katakura | G01D 5/244 341/112 |
| 2009/0167296 A1* | 7/2009 | Yokokawa | G01D 5/2449 324/207.25 |
| 2010/0117631 A1* | 5/2010 | Inoue | G01D 5/208 324/207.25 |
| 2011/0109304 A1* | 5/2011 | Suzuki | H02K 24/00 324/207.25 |
| 2016/0226508 A1 | 8/2016 | Kurooka et al. | |
| 2019/0293429 A1* | 9/2019 | Cameron | G01C 19/16 |
| 2019/0296761 A1* | 9/2019 | Cameron | G01C 21/188 |
| 2021/0064361 A1* | 3/2021 | Jayaraman | G06N 20/10 |
| 2021/0325420 A1 | 10/2021 | Rao et al. | |
| 2023/0194611 A1* | 6/2023 | Lee | G01D 5/204 324/765.01 |
| 2024/0177029 A1* | 5/2024 | Kalia | G06F 40/40 |

FOREIGN PATENT DOCUMENTS

| | | |
|---|---|---|
| EP | 3483563 B1 | 8/2020 |
| EP | 2546610 B1 | 9/2020 |
| WO | 2021241393 A1 | 12/2021 |

OTHER PUBLICATIONS

European Search Report for Application No. 24163838.6, mailed Jul. 29, 2024, 8 pages.

* cited by examiner

TIMER-BASED RESOLVER INTEGRAL DEMODULATION

CROSS-REFERENCE TO RELATED APPLICATIONS

This application claims the benefit of Indian Patent Application No. 202311017662 filed Mar. 16, 2023, which is incorporated herein by reference in its entirety.

BACKGROUND

The subject matter disclosed herein generally relates to signal processing and, more particularly, to timer-based resolver integral demodulation.

A resolver, also referred to as a motor resolver, is an electrical transformer that measures angle of rotation. Resolvers are made up of a rotor and a stator. The rotor is mounted on a shaft of a device (e.g., motor, turbine engine, etc.) to be monitored, for example. The stator includes multiple transformers (also referred to as "windings"), for example, an input transformer and two output transformers. As an input signal (also referred to as a "reference" signal or an "excitation" signal) is applied to the input transformer, one of the output transformers generates a sine output and the other of the output transformers generates a cosine output.

BRIEF DESCRIPTION

In one embodiment, a method for determining a location of a resolver is disclosed. The method can include: creating a resolver excitation signal from a series of samples; generating an incrementing Select/Zero Crossing signal that increments each time the resolver excitation signal crosses zero; providing the resolver excitation signal to the resolver; receiving at a multiplexer resolver sine and resolver cosine signals from the resolver that are based on the excitation signal; when the Select/Zero Crossing signal has a first value, providing the resolver sine signal to an analog to digital converter to convert the resolver sine signal to a series of digital sine samples, and storing the series of digital sine samples in a sine sample buffer; when the Select/Zero Crossing signal has a second value, providing the resolver cosine signal to the analog to digital converter to convert the resolver cosine signal to a series of digital cosine samples, and storing the series of digital cosine samples in a cosine sample buffer; determining a sine amplitude-based series of digital sine samples; determining a cosine amplitude-based series of digital cosine samples; and identifying a quadrant of the resolver position based on the sine and cosine amplitudes.

According to any method disclosed herein, the resolver sine samples and the resolver cosine samples can be collected at different times.

According to any method disclosed herein, the resolver sine samples and the resolver cosine samples can each be created for a half period of the resolver excitation signal.

According to any method disclosed herein, identifying the quadrant of the resolver position can include doubling the sine amplitude and the cosine amplitude.

According to any method disclosed herein, the resolver excitation signal can be created by a first timer.

According to any method disclosed herein, the first timer can be a N2HET timer.

According to any method disclosed herein, the method can further include providing the digital sine samples to a second timer, wherein the second timer provides the digital sine samples to the sine sample buffer based on the Select/Zero Crossing signal.

According to any method disclosed herein, the method can further include providing the digital cosine samples to the second timer, wherein the second timer provides the digital cosine samples to the cosine sample buffer based on the Select/Zero Crossing signal.

According to any method disclosed herein, the second timer can a N2HET timer.

According to any method disclosed herein, the first timer creates the Select/Zero Crossing signal and provides it to the multiplexer and to a second timer.

Also disclosed is digital signal processing system to determine a position of a resolver. This system can perform any method as disclosed above. The system can include: a digital signal processor that includes first timer and second timer, wherein the first timer creates a resolver excitation signal from a series of samples and creates an incrementing Select/Zero Crossing signal each the resolver excitation signal crosses zero; a multiplexer configured to receive resolver sine and resolver cosine signals from the resolver that are based on the excitation signal, the multiplexer having a select input receiving the Select/Zero Crossing signal; an analog to digital converter connected to an output of the multiplexer, the analog to digital converter having an output connected to the second timer; and a memory buffer connected to the second timer that includes a sine sample buffer and a cosine sample buffer. When the Select/Zero Crossing signal has a first value, the multiplexer provides the resolver sine signal to the analog to digital converter to convert the resolver sine signal to a series of digital sine samples, and the second timer stores the series of digital sine samples in the sine sample buffer. When the Select/Zero Crossing signal has a second value, the multiplexer provides the resolver cosine signal to the analog to digital converter to convert the resolver cosine signal to a series of digital cosine samples, and the second timer storing the series of digital cosine samples in the cosine sample buffer.

In any system herein, the resolver sine samples and the resolver cosine samples can be collected at different times.

In any system herein, the resolver sine samples and the resolver cosine samples can each be created for a half period of the resolver excitation signal.

In any system herein, the first and/or second timers can be N2HET timers.

In any system herein, the first timer can provide the Select/Zero Crossing signal to the second timer.

The above features and advantages, and other features and advantages, of the disclosure are readily apparent from the following detailed description when taken in connection with the accompanying drawings.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

Figure 1A:
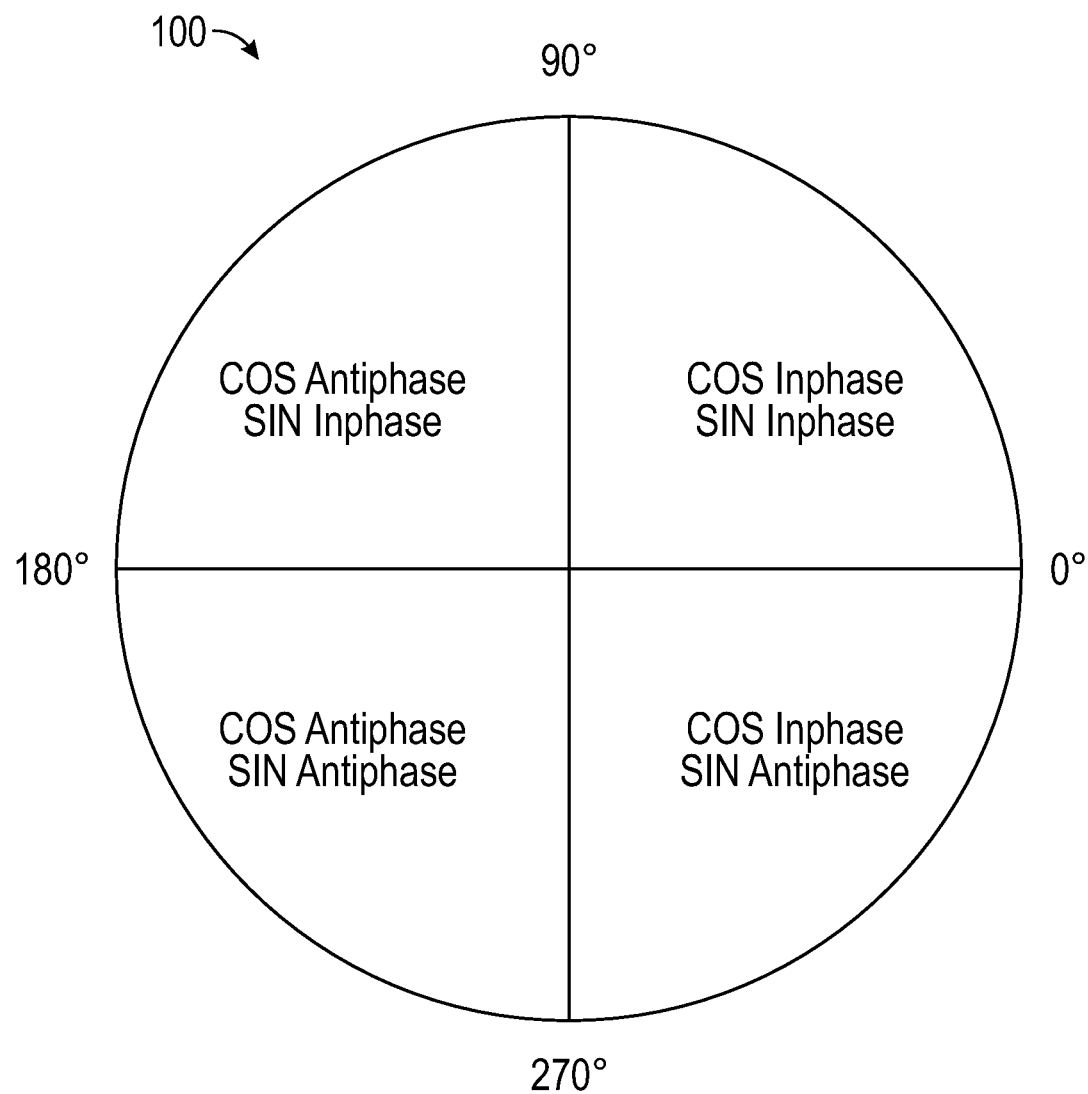
FIGS. 1A-1C show the resolver quadrants and the sign of the feedback signals in each quadrant according to one or more embodiments described herein.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

Turning to an overview of technologies that are more specifically relevant to aspects of the present disclosure, a resolver or multiple resolvers can be used to measure rotation, such as of a motor, turbine engine, etc. In some cases, three resolvers may be used. Resolvers are excited with an excitation signal. The resolver provides three analog feedback signals, which take the form of sinusoids, as follows: the excitation signal, a sine signal, and a cosine signal.

Figure 1B:
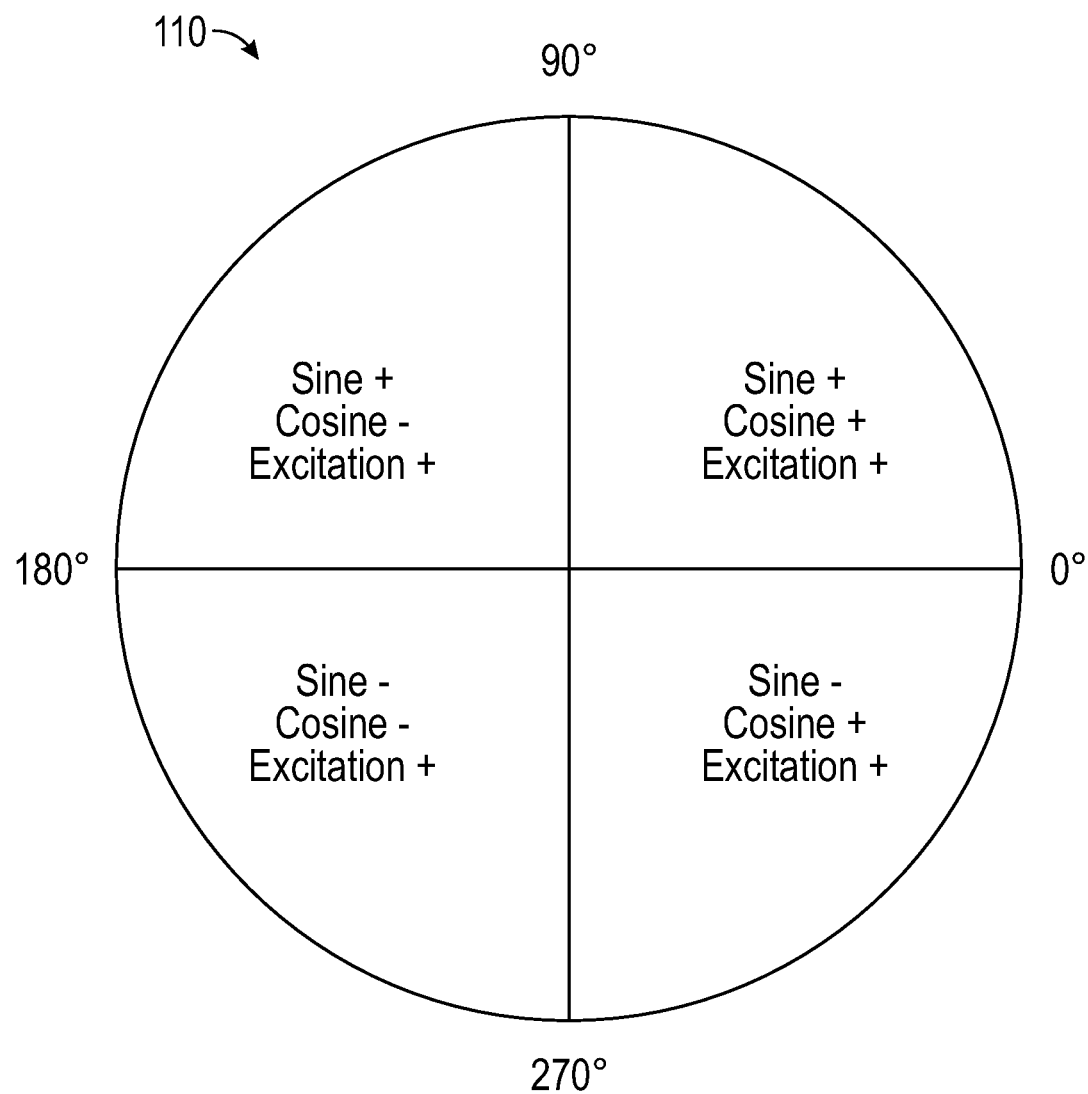
Figure 1C:
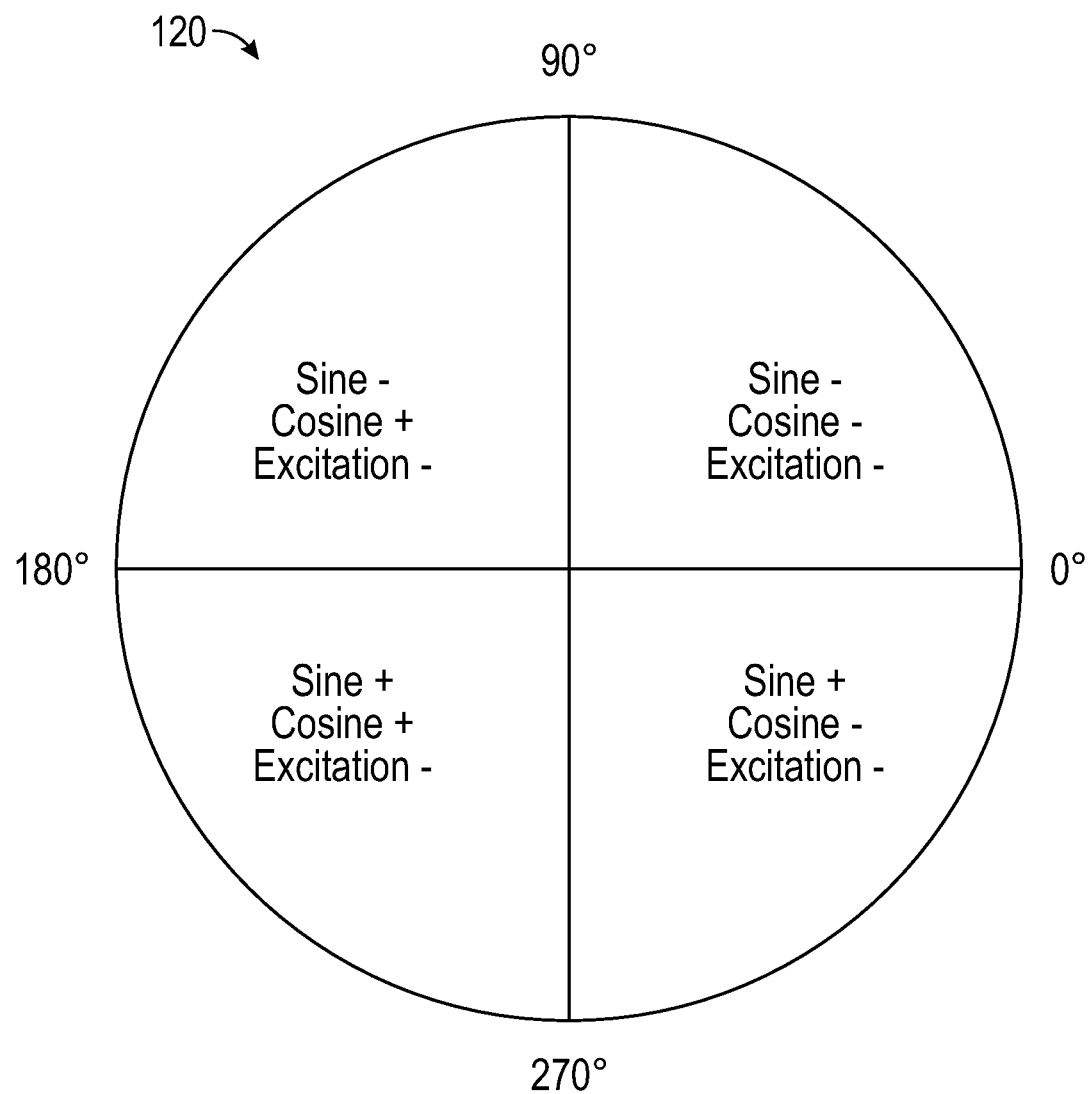

Demodulation of the resolver sine and cosine signals is utilized in many signal processing applications. In the demodulation of the resolver sine and cosine signals, a quadrant of the resolver position is determined based on the signs of the excitation, sine, and cosine signals. FIGS. 1A-1C show the resolver quadrants and the sign of the feedback signals in each quadrant. Particularly, FIG. 1A depicts a graphical representation 100 of resolver signals phase relationships across four quadrants. FIG. 1B depicts a graphical representation 110 of resolver signals phase relationships across four quadrants where the amplitude of the excitation signal is positive (i.e., greater than zero). FIG. 1C depicts a graphical representation 120 of resolver signals phase relationships across four quadrants where the amplitude of the excitation signal is negative (i.e., less than zero).

Many existing demodulation algorithms for determining a quadrant of the resolver position are time consuming, resource intensive, and/or inaccurate. Conventionally, the feedback signals are fed into the three separate analog to digital converters (ADCs), and the digitally converted data from the ADCs is fed into a digital signal processor (DSP). More particularly, resolver feedback signals sample data are collected into buffers, such as one buffer per resolver (e.g., three buffers for three resolvers): one for the excitation signal (ExcitationRAMBuffer), one for sine signal (SineRAMBuffer), and one for cosine signal (CosineRAMBuffer). These buffers are used to demodulate the feedback signals and determine the rotational position of the resolver. Once a required number of samples are collected, the resolver signal demodulation is performed using an integral demodulation algorithm. The integral demodulation is performed by integrating at least one full period of the sine and cosine feedback samples rectified about their respective midpoints and calculating the angular position using trigonometric relationships and the excitation reference to determine the quadrant of the angular position. This approach has several disadvantages. First, to determine a more accurate resolver position, each of the three feedback signals must be sampled simultaneously; however, conventional approaches acquire the three feedback signals using three different ADCs. This results in a phase delay of minimum one sample and hence produces less accurate results. Second, this approach uses more processing time/resources for the integral demodulation and quadrant determination because the resolver signals integration is done for the full period of the feedback signals and because each excitation sample is compared to identify the quadrant information.

One or more embodiments described herein address these and other shortcomings by implementing a DSP that includes specialized micro-machine that operates on a reduced instruction set. Such timers are often referred to as N2HET timer. Herein, such timers are used to control the movement of data into the DSP memory buffer. These operations can be performed "outside" of the processing of the DSP. In particular, such timers after initialization can be used to load the DSP memory (or memory buffer) without requiring that the DSP include code that controls the loading of the memory.

In one embodiment, one of the timers generates the resolver excitation signal. That same timer also sends select/zero crossing signals related to that signal to a multiplexer to select/step through the excitation, return sine (Resolver Sine) and cosine (Resolver Cosine) signals received back from the resolver (and optionally, one or more (DC) calibration signals). That same signal can be used to route the selected signals to the correction location in the memory buffer. This can be accomplished, for example, by changing/incrementing the selection signal each time the excitation signal crosses zero. Thus, for example, the Resolver Cosine and Resolver Sine signals could be analyzed and stored during the positive halfwaves of the excitation signal and the other signals (e.g., excitation and calibration) can be operated on during the negative half waves. Operating in this manner still allows use of the excitation signal to identify the quadrant of Resolver Sine and Resolver Cosine signal. However, as the samples are collected from a zero-crossing point, only samples for half period are to be integrated and the integral output is multiplied by two to get the amplitude. Also, since the excitation is generated by the internal N2HET timers, synchronization of the sine and cosine signals acquisition with the zero crossing of the excitation signal, the excitation signal samples are not required for demodulation.

Figure 2:
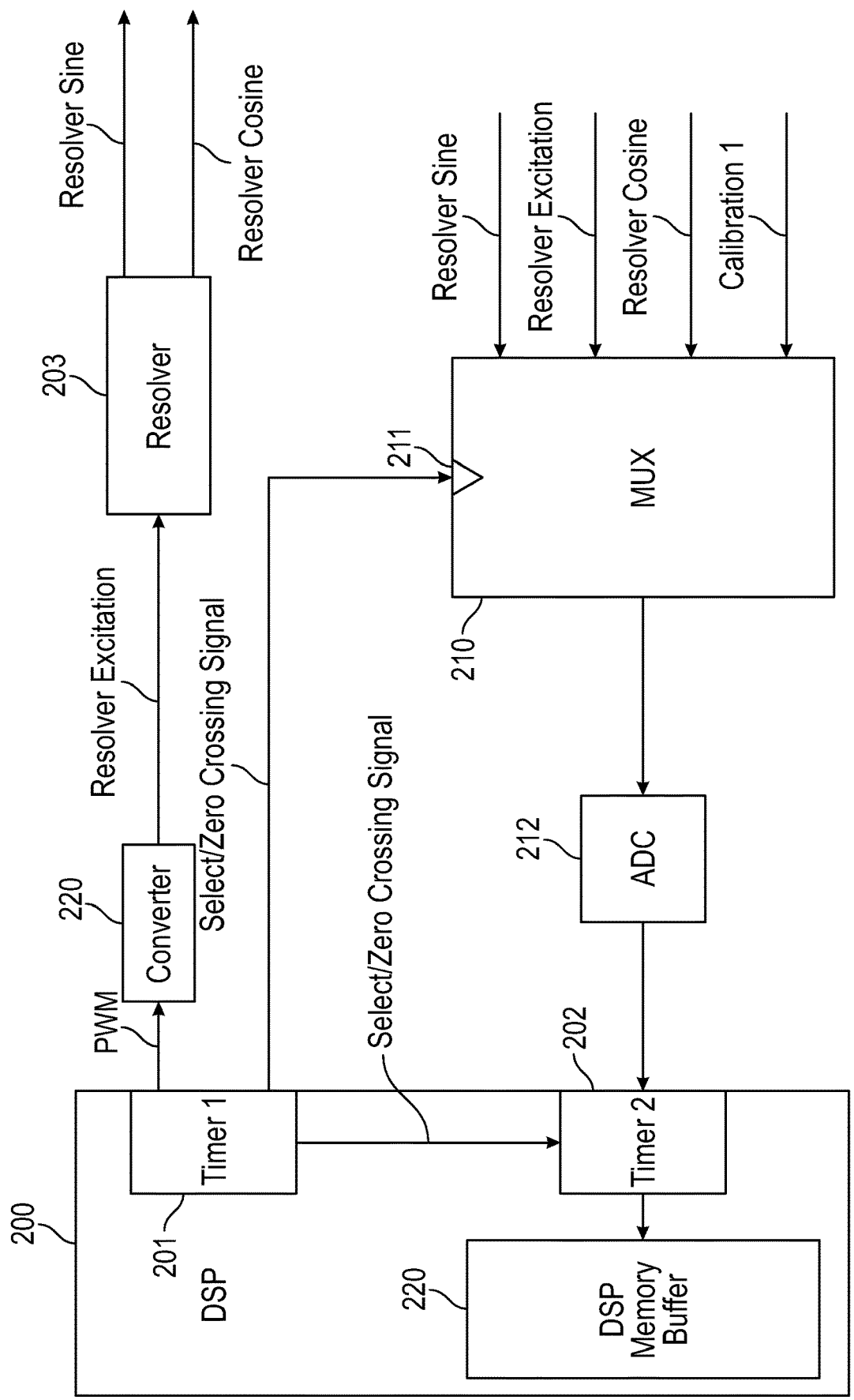
FIG. 2 depicts an example of a digital signal processing system that includes two timers according to one or more embodiments described herein.

FIG. 2 depicts an example of a digital signal processor 200 that includes two timers 201, 202. In one embodiment, the timers 201, 202 are N2HET timers. The first timer 201 generates a digital (e.g., PWM) signal that can be converted by a signal converter 220 (e.g., a digital to analog converter) and provided as an analog signal (resolver excitation signal) that is provided to a resolver 203. As discussed above, the resolver 203 receives as an input signal (also referred to as a "reference" signal or an "resolver excitation" signal) is applied to the input transformer, one of the output transformers generates Resolver Sine and Resolver Cosine outputs.

The Resolver Sine and Resolver Cosine outputs are provided to a multiplexer 210. In addition, the multiplexer can optionally receive a resolver excitation input and one or more calibration inputs as indicated by the Calibration 1. The multiplexer selector input 211 will receive in the example, shown, a two-bit selector signal (Select/Zero Crossing Signal from the first timer 201. The multiplexer 210 will select which signal is provided to an analog to digital converter (ADC) 212. If more signals are to be monitored, the number of bits could be increased.

Figure 3:
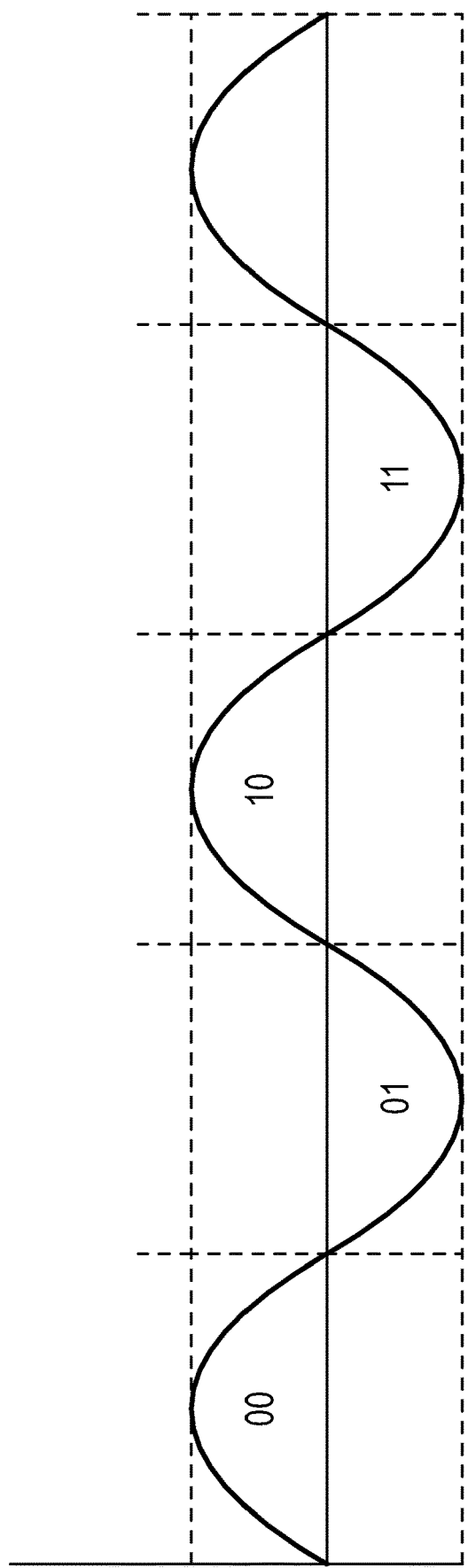
FIG. 3 depicts a flow diagram of a method for determining resolver position according to one or more embodiments described herein.

Reference will now be made to FIG. 3 in addition to FIG. 2. FIG. 3 shows an example Resolver Signal. In FIG. 3 different quadrants of the Resolver Signal are labelled. These labels represent different binary representations Select/Zero Crossing Signals shown in FIG. 2. For example, signal 00 can cause the multiplexer 210 to select the Resolver Sine signal, signal 01 can select the Resolver Excitation signal, signal 10 can cause the multiplexer 210 to select the Resolver Cosine signal and signal 11 can cause the multiplexer 210 to select the Calibration 1 signal. The same signal can also be provided to the second timer 202. Thus, each time the Select/Zero Crossing Signal increments, the second timer 202 will know to switch which buffer location to send the received data (see, e.g., FIG. 4).

It is noted that the selection being based on the zero crossing in the above described manner can allow for simple and synchronized data placement in the memory buffer 220 that is independent of any measured signal. This is different than prior system that had to sample the excitation signal samples to demodulate the Sine and Cosine signals.

The selected signal is then provided to the ADC 212. The signal can then converted from analog to digital and provided to the second timer 202. The second timer then writes the data (sample data) to a block of the buffer 220 designated for the selected data (e.g., selected by the Select/Zero Crossing signal).

Figure 4:
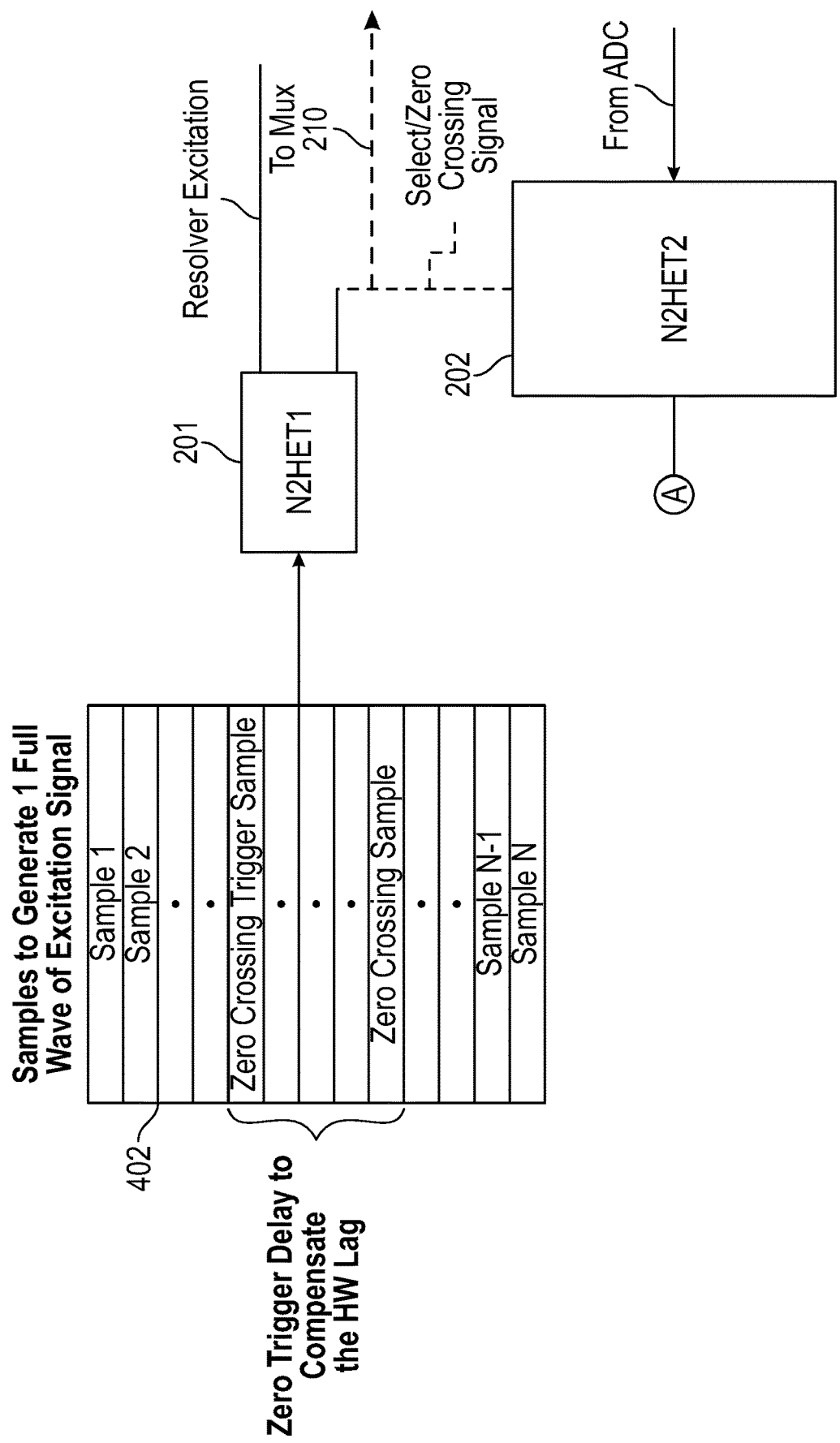
FIG. 4 depicts a flow diagram of a method for determining resolver position according to one or more embodiments described herein.
Figure 4:
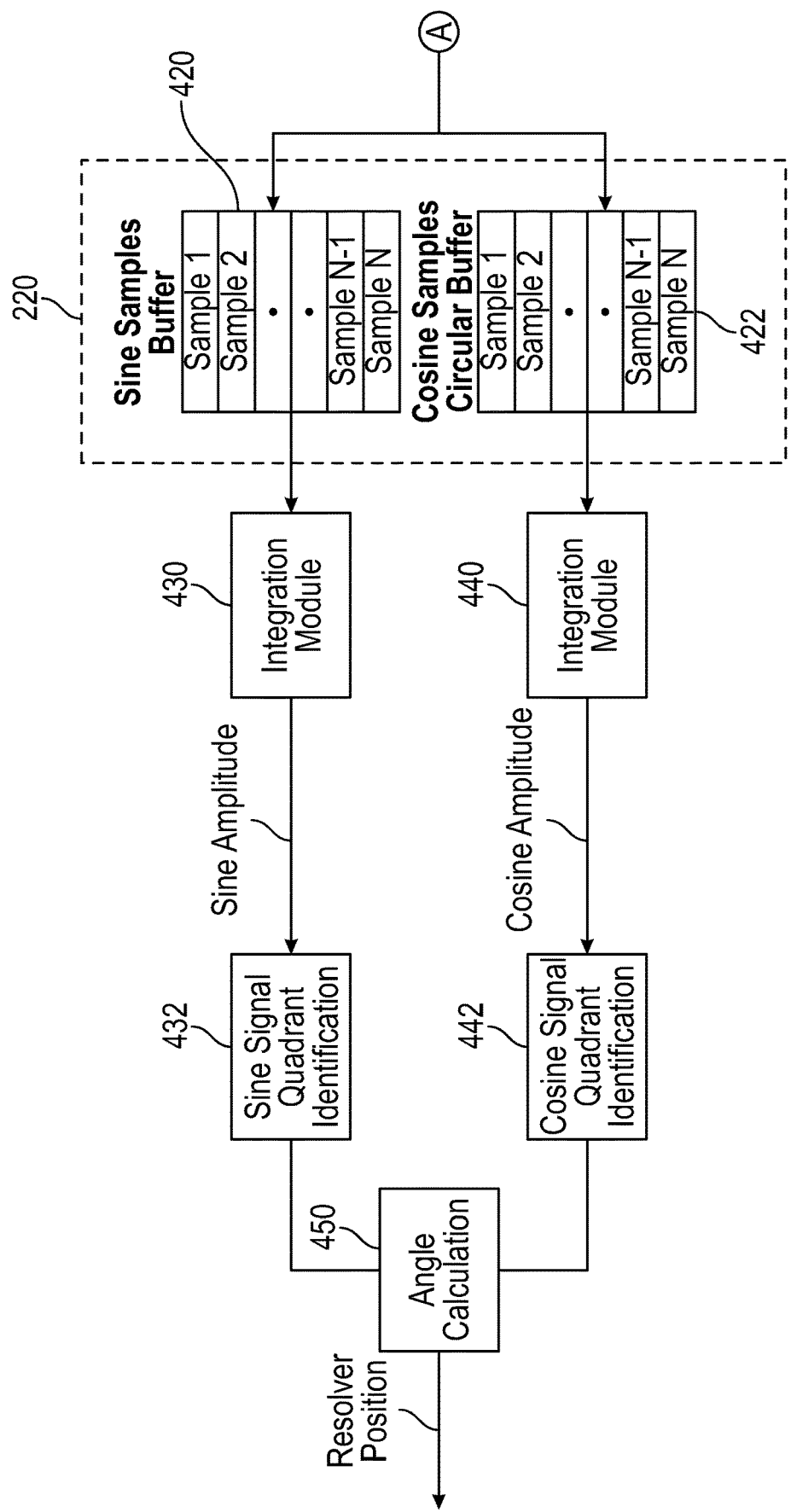

FIG. 4 shows a data flow diagram used to describe a method for determining resolver position according to one or more embodiments. In FIG. 4, an excitation signal buffer 402 is provided. This buffer 402 can include a series of values/samples that can be provided to the first timer 201. As will be understood, this series of values will include zero or close to zero values from time to time and these values are indicated as zero crossing triggers in the buffer shown in FIG. 4. From the samples, the first timer 201 produces the Resolver Excitation signal and the Select/Zero Crossing signal. Each time a zero crossing is encountered (and perhaps at other times if needed), the Select/Zero Crossing signal is incremented. This will "step" the multiplexer 210 to step through its inputs as discussed below.

Further, the Select/Zero Crossing signal is also provided to the second timer 202. In FIG. 4 the buffer 220 of FIG. 2 is shown as having two sections, a sine samples buffer 420 and a cosine samples buffer 422. When the Select/Zero Crossing signal indicates that sine samples are being received (e.g., is 00 in the above example) the samples received from the ADC 212 are stored in the sine samples buffer 420. When the Select/Zero Crossing signal indicates that cosine samples are being received (e.g., 10 in the above example) the samples received from the ADC 212 are stored in the cosine samples buffer 422. Other signals can be stored in other locations but for simplicity only two individual locations are shown in FIG. 4.

Data from the sine samples buffer 420 is fed into a sine integration block 430. The first integration block outputs a sine amplitude. As noted above, as only half a wavelength is utilized, this amplitude may be a scaled by a factor of 2 from the actual integrated value. The sine output is provided to a sine quadrant identification block 432.

Similarly, data from the cosine samples buffer 422 is fed into a cosine integration block 440. The first integration block outputs a cosine amplitude. As noted above, as only half a wavelength is utilized, this amplitude may be a scaled by a factor of 2 from the actual integrated value. The cosine output is provided to a cosine quadrant identification block 442.

More particularly, the sine and cosine integration blocks 430, 440 respectively, integrate half periods of the cosine and sine feedback samples. Once a threshold number of samples are collected, resolver signal demodulation is performed using an integral demodulation approach. Pseudocode of an example of such an integral demodulation approach is as follows:

For each sample (i) in numSamples:

```
sinSum += (sinBuffer[i] )
cosSum += (cosBuffer[i])
SineSum = 2 x SineSum
CosineSum = 2 x CosineSum.
```

As opposed to prior art systems, as the zero crossing are used to allocate buffer locations etc., the above does not need to monitor the excitation signal to perform these calculations.

The sine and cosine amplitudes can, respectively, be provided to sine and cosine quadrant identification blocks 432, 442. Quadrant identification blocks, 432, 442 determine, based on the sine amplitude and the cosine amplitude, a quadrant of the resolver (see, e.g., FIGS. 1A-1C). An angle determination module 450 uses the identified quadrant to determine a resolver position.

Figure 5:
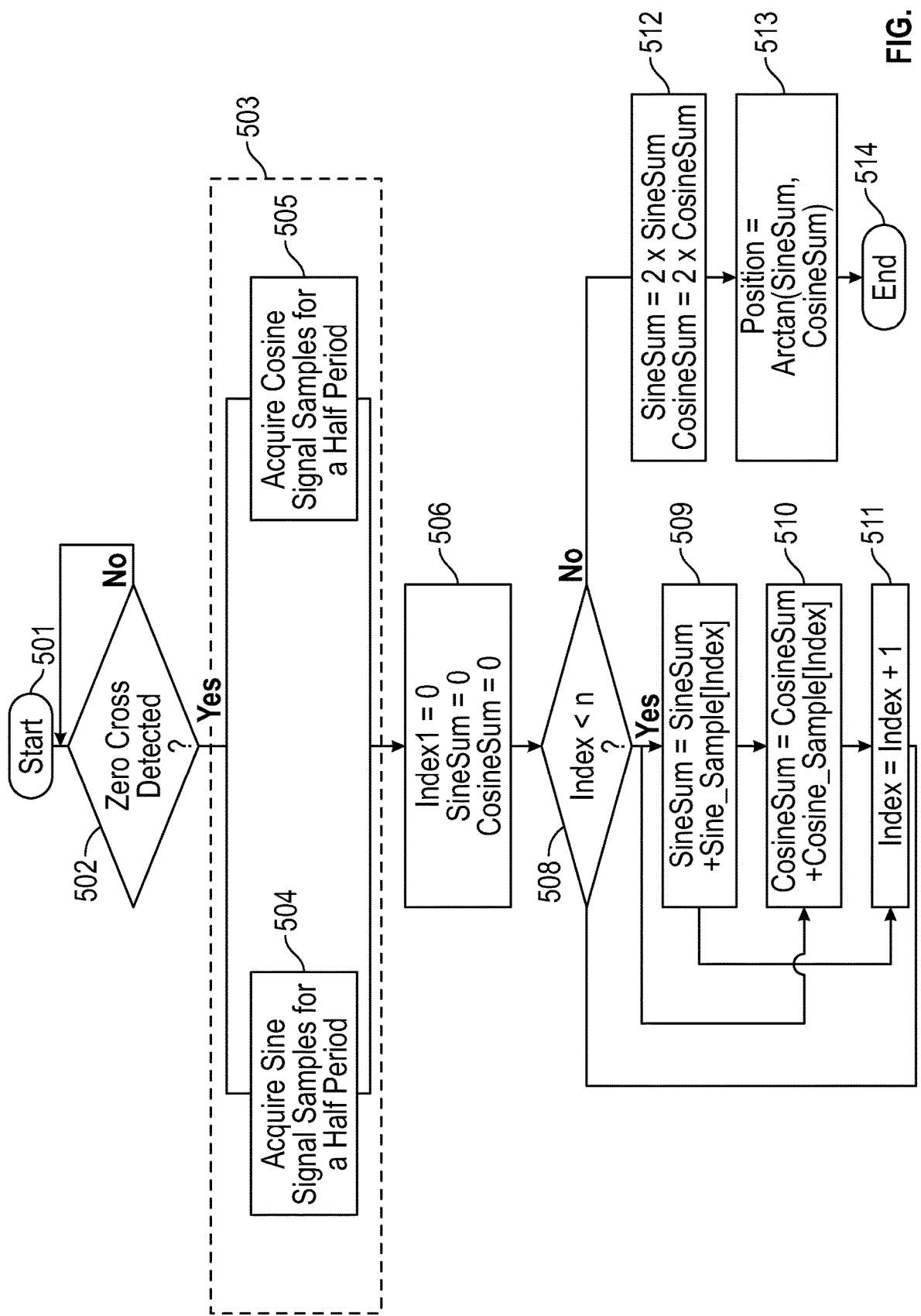
FIG. 5 depicts a flow diagram of a method for performing integral demodulation using a zero-crossing point of the excitation signal according to one or more embodiments described herein.

FIG. 5 depicts a flow diagram of a method 500 for performing integral demodulation using a zero-crossing point of the excitation signal according to one or more embodiments described herein. The method starts at block 501 and proceeds to decision block 502, where it is determined whether a zero crossing is detected. This determination repeats until a zero crossing is detected at which point the method 500 proceeds to blocks 503. In block 503 signals can routed to the ADC as described above based on the Select/Zero Crossing signal. This will result in the acquisition and storing of sine signal samples for a half period (block 504) and in the acquisition and storing of cosine signal samples for a half period (block 505). While not illustrated, it shall be understood that other samples can be acquired and stored. For example, excitation signal samples can be acquired and stored. However, those signals are not required in the following calculations.

It shall be understood that each time a zero crossing is encountered in the Select/Zero Crossing signal can be incremented until it reaches a "top" value and then reset to zero. In the above example, the increments go as follows: 00, 01, 10, 11, 00, 01 and so on.

The method 500 proceeds to block 506, where values for "index1," "sinesum," and "cosine sum" are set to zero.

The method 500 proceeds to decision block 508, where it is determined whether the index (e.g., "index1" from block 506) is less than a value n. If so, the method 500 proceeds to blocks 509 and 510. At block 509, a value Sinesum is set to a previous Sinesum value plus a sine sample for the current index. Similarly, at block 510, a value Cosinesum is set to a previous Cosinesum value plus a cosine sample for the current index. After blocks 509, 510, the method 500 proceeds to block 511 where the index is incremented and the method 500 returns to decision block 508.

If, at decision block 508 it is determined that the index is not less than the value n, the method 500 proceeds to block 512 where the SineSum and CosineSum values are calculated, respectively, by doubling the previous SineSum and CosineSum values.

At block 513, the position is determined using the SineSum and CosineSum values from block 512. For example, the position is determined using the arctan of the SineSum and CosineSum values from block 516. The method 500 then ends at block 514.

Additional processes also may be included, and it should be understood that the process depicted in FIG. 5 represents an illustration, and that other processes may be added or existing processes may be removed, modified, or rearranged without departing from the scope of the present disclosure.

It is understood that one or more embodiments described herein is capable of being implemented in conjunction with any other type of computing environment now known or later developed.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

What is claimed is:

1. A method for determining a location of a resolver, the method comprising:
    creating a resolver excitation signal from a series of samples;
    generating an incrementing Select/Zero Crossing signal that increments each time the resolver excitation signal crosses zero;
    providing the resolver excitation signal to the resolver;
    receiving at a multiplexer resolver sine and resolver cosine signals from the resolver that are based on the excitation signal;
    when the Select/Zero Crossing signal has a first value, providing the resolver sine signal to an analog to digital converter to convert the resolver sine signal to a series of digital sine samples, and storing the series of digital sine samples in a sine sample buffer;
    when the Select/Zero Crossing signal has a second value, providing the resolver cosine signal to the analog to digital converter to convert the resolver cosine signal to a series of digital cosine samples, and storing the series of digital cosine samples in a cosine sample buffer;
    determining a sine amplitude-based series of digital sine samples;
    determining a cosine amplitude-based series of digital cosine samples; and
    identifying a quadrant of the resolver position based on the sine and cosine amplitudes.

2. The method of claim 1, wherein the resolver sine samples and the resolver cosine samples are collected at different times.

3. The method of claim 2, wherein the resolver sine samples and the resolver cosine samples are each created for a half period of the resolver excitation signal.

4. The method of claim 1, wherein identifying the quadrant of the resolver position comprises doubling the sine amplitude and the cosine amplitude.

5. The method of claim 1, wherein the resolver excitation signal is created by a first timer.

6. The method of claim 5, wherein the first timer is a N2HET timer.

7. The method of claim 1, further comprising:
    providing the digital sine samples to a second timer, wherein the second timer provides the digital sine samples to the sine sample buffer based on the Select/Zero Crossing signal.

8. The method of claim 7, further comprising:
    providing the digital cosine samples to the second timer, wherein the second timer provides the digital cosine samples to the cosine sample buffer based on the Select/Zero Crossing signal.

9. The method of claim 8, wherein the second timer is a N2HET timer.

10. The method of claim 5, wherein the first timer creates the Select/Zero Crossing signal and provides it to the multiplier and to a second timer.

11. A digital signal processing system to determine a position of a resolver, the system comprising:
- a digital signal processor that includes first timer and second timer, wherein the first timer creates a resolver excitation signal from a series of samples and creates an incrementing Select/Zero Crossing signal each the resolver excitation signal crosses zero;
- a multiplexer configured to receive resolver sine and resolver cosine signals from the resolver that are based on the excitation signal, the multiplexer having a select input receiving the Select/Zero Crossing signal;
- an analog to digital converter connected to an output of the multiplexer, the analog to digital converter having an output connected to the second timer; and
- a memory buffer connected to the second timer that includes a sine sample buffer and a cosine sample buffer;

wherein when the Select/Zero Crossing signal has a first value, the multiplexer provides the resolver sine signal to the analog to digital converter to convert the resolver sine signal to a series of digital sine samples, and the second timer stores the series of digital sine samples in the sine sample buffer; and wherein when the Select/Zero Crossing signal has a second value, the multiplexer provides the resolver cosine signal to the analog to digital converter to convert the resolver cosine signal to a series of digital cosine samples, and the second timer storing the series of digital cosine samples in the cosine sample buffer.

12. The system of claim 11, wherein the resolver sine samples and the resolver cosine samples are collected at different times.

13. The system of claim 12, wherein the resolver sine samples and the resolver cosine samples are each created for a half period of the resolver excitation signal.

14. The system of claim 11, wherein the first timer is a N2HET timer.

15. The method of claim 14, wherein the second timer is a N2HET timer and the first timer provides the Select/Zero Crossing signal to the second timer.

* * * * *